(12) United States Patent
Tsuboi et al.

(10) Patent No.: US 9,468,130 B2
(45) Date of Patent: Oct. 11, 2016

(54) MICRO CHANNEL COOLING DEVICE, MICRO CHANNEL COOLING SYSTEM, AND ELECTRONIC INSTRUMENT

(71) Applicant: FUJITSU LIMITED, Kawasaki-shi, Kanagawa (JP)

(72) Inventors: Osamu Tsuboi, Kawasaki (JP); Norinao Kouma, Atsugi (JP); Yoshihiro Mizuno, Kobe (JP)

(73) Assignee: FUJITSU LIMITED, Kawasaki (JP)

( * ) Notice: Subject to any disclaimer, the term of this patent is extended or adjusted under 35 U.S.C. 154(b) by 267 days.

(21) Appl. No.: 14/252,308

(22) Filed: Apr. 14, 2014

(65) Prior Publication Data

US 2014/0216058 A1     Aug. 7, 2014

Related U.S. Application Data

(63) Continuation of application No. PCT/JP2011/075509, filed on Nov. 4, 2011.

(51) Int. Cl.

| | |
|---|---|
| *F25B 21/02* | (2006.01) |
| *H05K 7/20* | (2006.01) |
| *G06F 1/20* | (2006.01) |
| *H01L 23/38* | (2006.01) |
| *F25B 21/00* | (2006.01) |
| *H01L 23/473* | (2006.01) |

(52) U.S. Cl.
CPC ............... *H05K 7/20* (2013.01); *F25B 21/00* (2013.01); *G06F 1/20* (2013.01); *H01L 23/38* (2013.01); *H01L 23/473* (2013.01); *F25B 2321/001* (2013.01); *H01L 2924/0002* (2013.01)

(58) Field of Classification Search
CPC .......... F25B 21/02; F25B 21/04; H01L 35/30
USPC ............................................. 62/3.1, 3.2, 3.3
See application file for complete search history.

(56) References Cited

U.S. PATENT DOCUMENTS

| | | | | |
|---|---|---|---|---|
| 5,269,375 | A * | 12/1993 | Schroeder, Jr. | ....... E21B 43/045 166/278 |
| 5,696,405 | A * | 12/1997 | Weld | ..................... H01L 23/473 257/714 |
| 6,595,006 | B2 * | 7/2003 | Thiesen | .................. F01K 25/08 60/636 |
| 6,799,282 | B2 | 9/2004 | Maeda et al. | |
| 7,170,000 | B2 | 1/2007 | Maeda et al. | |

(Continued)

FOREIGN PATENT DOCUMENTS

| | | |
|---|---|---|
| CN | 1930681 | 3/2007 |
| CN | 102169838 | 8/2011 |

(Continued)

OTHER PUBLICATIONS

International Search Report, mailed in connection with PCT/JP2011/075509 and mailed Jan. 31, 2012.

(Continued)

*Primary Examiner* — Melvin Jones
(74) *Attorney, Agent, or Firm* — Fujitsu Patent Center

(57) ABSTRACT

A microchannel cooling device includes a heat sink having a liquid refrigerant flow channel having a microscopic cross section and connected to a heat source thermally, and a thermoelectric element provided on the heat sink and extending parallel to a direction of extension of the liquid refrigerant flow channel.

12 Claims, 10 Drawing Sheets

1

(56) References Cited

U.S. PATENT DOCUMENTS

| | | |
|---|---|---|
| 2003/0192674 A1 | 10/2003 | Ippoushi et al. |
| 2005/0213301 A1 | 9/2005 | Prasher |
| 2007/0080471 A1 | 4/2007 | Yazawa |
| 2009/0308081 A1 | 12/2009 | Ouyang et al. |
| 2010/0046167 A1 | 2/2010 | Prasher |

FOREIGN PATENT DOCUMENTS

| | | |
|---|---|---|
| EP | 1494109 A2 | 1/2005 |
| EP | 1906463 A2 | 4/2008 |
| JP | 2001-282396 | 10/2001 |
| JP | 2003-269817 | 9/2003 |
| JP | 2004-003816 | 1/2004 |
| JP | 2006-242455 | 9/2006 |
| JP | 2007-109794 | 4/2007 |
| JP | 2008-016613 | 1/2008 |
| JP | 2009-194019 | 8/2009 |
| WO | 2011/060186 A2 | 5/2011 |

OTHER PUBLICATIONS

EESR—Extended European Search Report dated Mar. 3, 2015 issued with respect to the corresponding European Patent Application No. 11875170.0.

CNOA—Office Action mailed on Mar. 10, 2016 issued with respect to the corresponding Chinese Patent Application No. 201180074472.6, with full English translated office action.

\* cited by examiner

FIG.5A
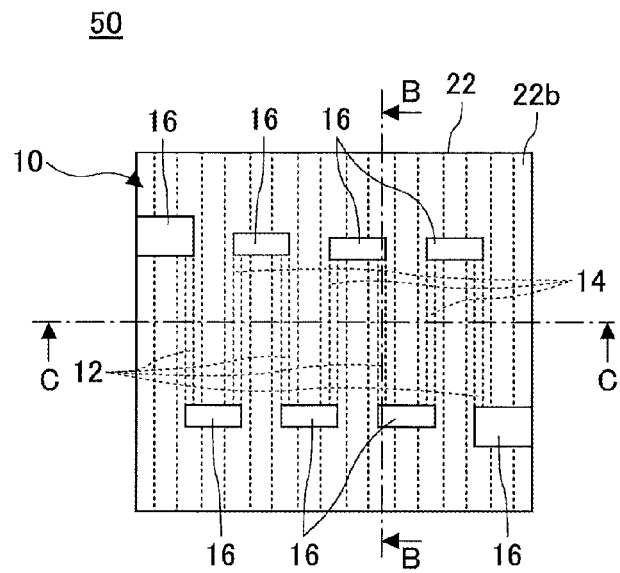
FIG.5B
FIG.5C
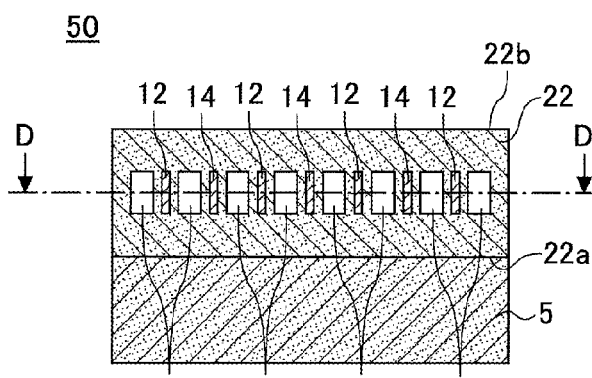
FIG.5D
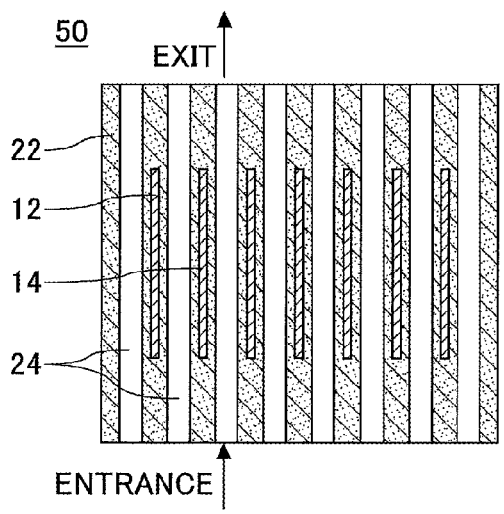

FIG.6A
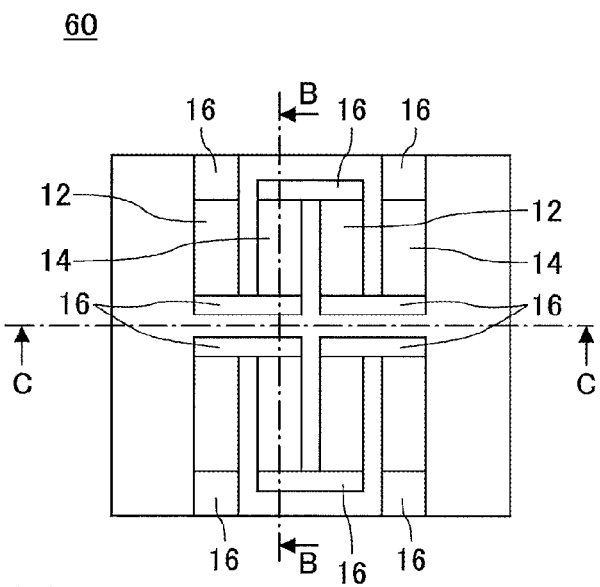
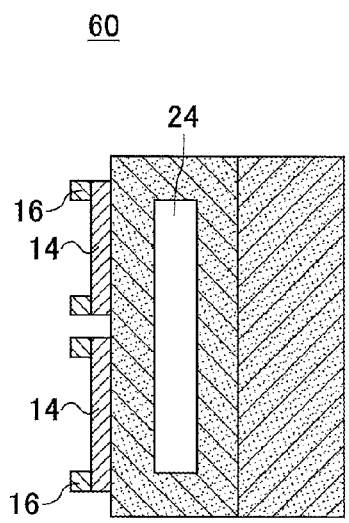
FIG.6B
FIG.6C
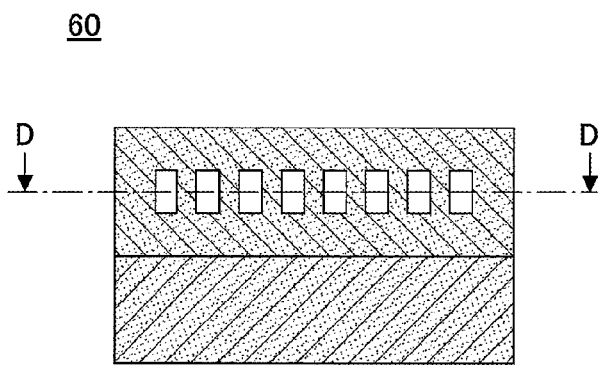
FIG.6D
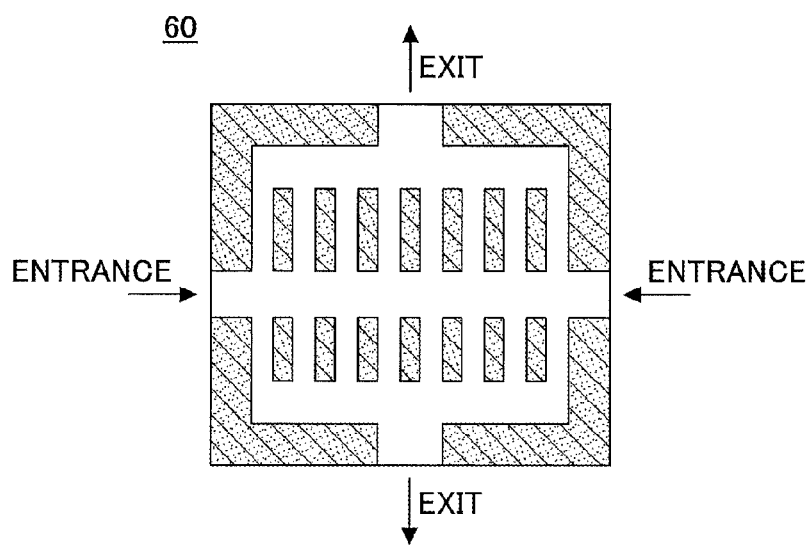

FIG.7A
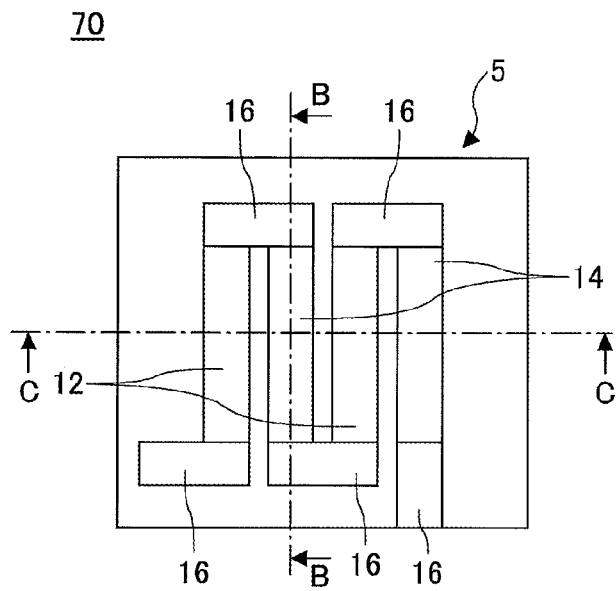
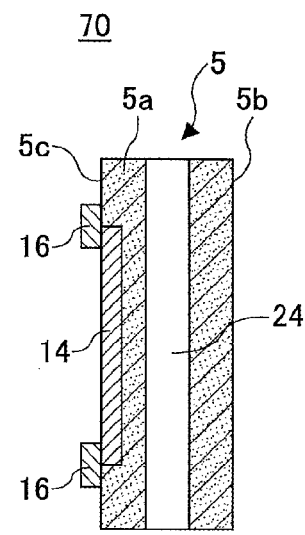
FIG.7B
FIG.7C
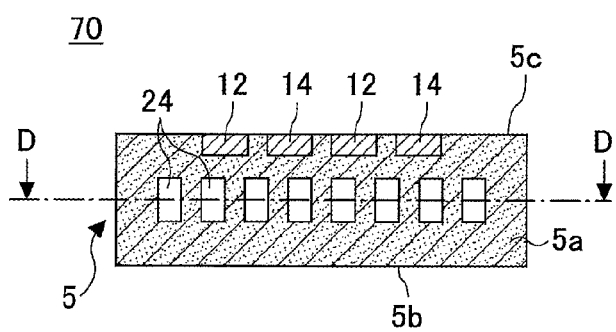
FIG.7D
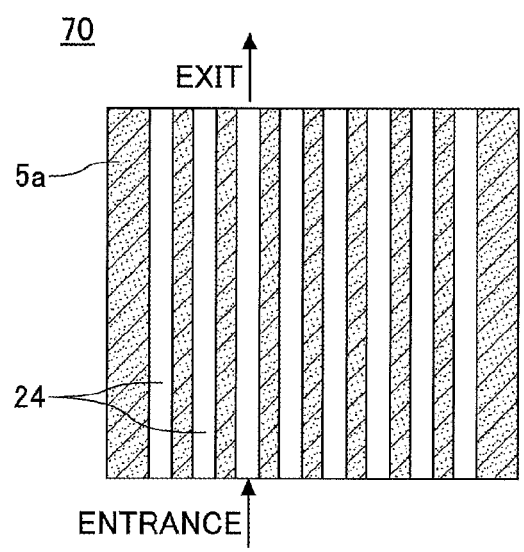

MICRO CHANNEL COOLING DEVICE, MICRO CHANNEL COOLING SYSTEM, AND ELECTRONIC INSTRUMENT

CROSS-REFERENCE TO RELATED APPLICATIONS

This application is a continuation of International Application No. PCT/JP2011/075509 filed on Nov. 4, 2011 and designated in the U.S., the entire contents of which are herein incorporated by reference.

FIELD

A certain aspect of the embodiments discussed herein relates to a microchannel cooling device, a microchannel cooling system, and an electronic instrument.

BACKGROUND

In recent years, a large amount of heat is generated at a time of an operation of an electronic device due to miniaturization or a high integration of an electronic device, such as by LSI or the like. Therefore, means for cooling an electronic device efficiently are proposed. For example, it is proposed that a water cooling type cooling device is used, because it is not possible to dissipate a large amount of heat by merely attaching a heat sink to an electronic device such as an LSI, to be air-cooled.

A general water cooling type cooling device is a cooling device for passing a refrigerant (a cooling water) through a closed heat sink referred to as a "water jacket" to be cooled. In particular, a microchannel cooling device among water cooling type cooling devices has a high cooling performance and is promising for cooling an LSI.

On the other hand, it is also proposed that thermal energy generated by an electronic device such as an LSI is recovered and reused as an electric power in order to attain energy saving in an electronic instrument. A thermoelectric element is frequently used in order to recover thermal energy as an electric power. A thermoelectric element is arranged between an LSI and a heat sink and a temperature difference between the LSI and the heat sink is applied to the thermoelectric element, so that the thermoelectric element generates an electric power. Alternatively, it is also proposed that a heat conductive member is drawn from an LSI that is a heating part and connected to a high temperature side of a thermoelectric element and a heat sink is connected to a low temperature side of the thermoelectric element so that a temperature difference is applied to the thermoelectric element and the thermoelectric element generates an electric power.

In order to utilize a temperature difference between a water cooling device for passing a refrigerant (a cooling water) through a conventional closed heat sink referred to as a "water jacket" to be cooled and an electronic component that is a heating part, it is necessary to connect a low temperature side of the thermoelectric element to the heat sink thermally and to connect a higher temperature side thereof to the electronic component thermally. For a configuration for inserting a thermoelectric component between a heat sink and an electronic component, a heat resistance of the thermoelectric element is high, so that it is not possible to transfer heat of the electronic component to the heat sink efficiently and it is not possible to cool the electronic component efficiently. Accordingly, cooling of an electronic component may be insufficient, because a thermoelectric element is provided, and a temperature of the electronic component may be high.

Furthermore, in a case where a heat conductive member is drawn from an electronic component as a heating part and connected to a high temperature side of a thermoelectric element, the heat conductive member is at a temperature of the electric component that has already been cooled, so that a temperature of the heat conductive member is not sufficiently high and it is not possible to obtain a large temperature difference. Because an amount of an electric power generated by a thermoelectric element is proportional to an applied temperature difference, an electric power capable of being generated by the thermoelectric element is small and an efficiency of recovery of energy is low.

Patent Document 1: Japanese Patent Application Publication No. 2001-282396

Patent Document 2: Japanese Patent Application Publication No. 2003-269817

SUMMARY

According to an aspect of the embodiments, a microchannel cooling device includes a heat sink having a liquid refrigerant flow channel having a microscopic cross section and connected to a heat source thermally, and a thermoelectric element provided on the heat sink and extending parallel to a direction of extension of the liquid refrigerant flow channel.

The object and advantages of the invention will be realized and attained by means of the elements and combinations particularly pointed out in the claims.

It is to be understood that both the forgoing general description and the following detailed description are exemplary and explanatory and are not restrictive of the invention.

BRIEF DESCRIPTION OF THE DRAWINGS

FIGS. 2A, 2B, 2C, and 2D are diagrams illustrating a microchannel cooling device according to a first embodiment, wherein FIG. 2A is a plan view of the microchannel cooling device, FIG. 2B is a cross-sectional view of FIG. 2A along a line B-B, FIG. 2C is a cross-sectional view of FIG. 2A along a line C-C, and FIG. 2D is a cross-sectional view of FIG. 2C along a line D-D;

FIGS. 3A, 3B, 3C, and 3D are diagrams illustrating a microchannel cooling device according to a second embodiment, wherein FIG. 3A is a plan view of the microchannel cooling device, FIG. 3B is a cross-sectional view of FIG. 3A along a line B-B, FIG. 3C is a cross-sectional view of FIG. 3A along a line C-C, and FIG. 3D is a cross-sectional view of FIG. 3C along a line D-D;

FIGS. 4A, 4B, 4C, and 4D are diagrams illustrating a microchannel cooling device according to a third embodiment, wherein FIG. 4A is a plan view of the microchannel cooling device, FIG. 4B is a cross-sectional view of FIG. 4A along a line B-B, FIG. 4C is a cross-sectional view of FIG. 4A along a line C-C, and FIG. 4D is a cross-sectional view of FIG. 4C along a line D-D;

FIGS. 5A, 5B, 5C, and 5D are diagrams illustrating a microchannel cooling device according to a fourth embodiment, wherein FIG. 5A is a plan view of the microchannel cooling device, FIG. 5B is a cross-sectional view of FIG. 5A along a line B-B, FIG. 5C is a cross-sectional view of FIG.

5A along a line C-C, and FIG. 5D is a cross-sectional view of FIG. 5C along a line D-D;

FIGS. 6A, 6B, 6C, and 6D are diagrams illustrating a microchannel cooling device according to a fifth embodiment, wherein FIG. 6A is a plan view of the microchannel cooling device, FIG. 6B is a cross-sectional view of FIG. 6A along a line B-B, FIG. 6C is a cross-sectional view of FIG. 6A along a line C-C, and FIG. 6D is a cross-sectional view of FIG. 6C along a line D-D;

FIGS. 7A, 7B, 7C, and 7D are diagrams illustrating a microchannel cooling device according to a sixth embodiment, wherein FIG. 7A is a plan view of the microchannel cooling device, FIG. 7B is a cross-sectional view of FIG. 7A along a line B-B, FIG. 7C is a cross-sectional view of FIG. 7A along a line C-C, and FIG. 7D is a cross-sectional view of FIG. 7C along a line D-D;

DESCRIPTION OF EMBODIMENT(S)

Figure 1:
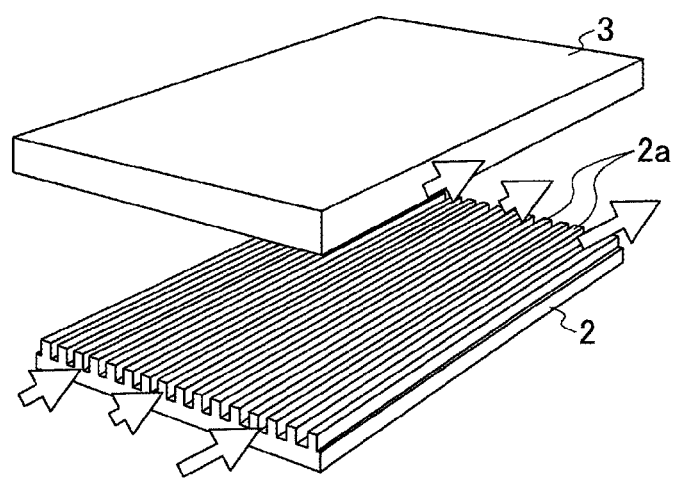
FIG. 1 is an exploded perspective view illustrating one example of a microchannel heat sink.

Next, embodiments will be described by referring to the drawings.

First, a microchannel heat sink will be described that is used in an embodiment of the present invention. A microchannel heat sink is frequently used as a cooling device for an electronic component such as an LSI. As a microchannel heat sink is used, it is possible to attain a cooling device that is more compact and has a high cooling performance.

FIG. 1 is an exploded perspective view of a microchannel heat sink. A microchannel heat sink is a heat sink wherein a liquid refrigerant flow channel having a microscopic cross section at an inside thereof (microchannel) is formed. A cooling water is frequently used as a liquid refrigerant, and a liquid refrigerant flow channel will be referred to as a "cooling water flow channel", below. As a liquid refrigerant (cooling water) at a low temperature flows in a cooling water flow channel, a heat sink, per se, is cooled so that it is possible to cool an electronic component connected to the heat sink. Generally, a cooling water flow channel of a microchannel heat sink has a cross-sectional shape and a cross-sectional dimension in such a manner that the Reynold's number thereof is less than 2000. As the Reynold's number is less than 2000, a flow of a cooling water that flows in a cooling water flow channel is a laminar flow. As the cooling water flows as a laminar flow, it is possible to transfer heat from an inner wall surface of a cooling water flow channel to the cooling water efficiently and it is possible to improve a cooling efficiency more than a case where the cooling water flows as a turbulent flow like in an existing heat sink.

FIG. 1 is an exploded perspective view illustrating one example of a microchannel heat sink. A microchannel heat sink 1 has a microchannel part 2 and a cover part 3 joined to cover the microchannel part 2. For a material for forming the microchannel part 2 and the cover part 3, a material with a good heat conductivity and easy to be microprocessed is suitable, and for example, a silicon as a semiconductor material is used. It is also possible to use a metallic material such as, for example, a copper or an aluminum, other than a silicon.

In the microchannel part 2, a plurality of groove parts (channels) 2a are formed to be juxtaposed in parallel. Each of the groove parts 2a corresponds to a cooling water flow channel. Each of the groove parts 2a has a cross-sectional shape and a cross-sectional dimension in such a manner that Reynold's numbers of cooling water flow channels formed on the groove parts 2a are less than 2000. For such a cross-sectional shape, a cross-sectional shape of a groove part 2a illustrated in FIG. 1 is a longitudinally long rectangular shape, wherein a short side and a long side are set at 70 μm and 350 μm. A shape of the groove part 2a is not limited to a rectangular shape, and further, a cross-sectional shape is also not limited to 70 μm×350 μm. As long as the Reynold's number is less than 2000, any cross-sectional shape/cross-sectional dimension of the groove part 2a is provided. The reason why the groove part 2a illustrated in FIG. 1 has a rectangular cross section is that it is easy to process grooves with a rectangular cross section.

Here, as a cross-sectional shape of a cooling water flow channel is a longitudinally long rectangular shape and a cooling water flows as a cooling refrigerant, and if a length of a diagonal line of the rectangular shape is equal to or less than 500 μm, it is possible for the Reynold's number of the cooling water flow channel to be less than 2000.

Herein, a temperature distribution of a microchannel heat sink was obtained by a simulation in a case where an electronic component was cooled by using a microchannel heat sink illustrated in FIG. 1. In the simulation, a microchannel heat sink was used that had two cooling water flow channels formed by groove part 2a. A microchannel heat sink will also be simply referred to as a "heat sink" below. The conditions were that heat was applied at 100 W/cm$^2$ from a bottom surface (a surface with an electronic component connected thereto) and a cooling water at 24° C. was supplied from one end side (an entrance side) to the cooling water flow channels in a flow rate to provide laminar flows. Cross-sectional shapes of the cooling water flow channels were longitudinally long rectangular shapes, wherein a short side and a long side were set at 70 μm and 350 μm. Furthermore, lengths of the cooling water flow channels were 10 mm.

As a result of the simulation, it was found that, as temperatures of the cooling water flow channels were 24° C. at the entrance sides thereof, the temperatures raised toward the opposite end sides (exit sides) and were 45° C. at the opposite end sides (exit sides) of the cooling water flow channels. That is, it was found that temperature differences between the cooling water entrance sides and exit sides of the heat sink were even equal to or higher than 20° C. It was not possible to obtain such temperature distributions in a conventional heat sink wherein the cooling water on a cooling water flow channel was a turbulent flow, and the temperature distributions were unique for a microchannel heat sink.

Then, attention was paid to a temperature difference obtained from a temperature distribution of the microchannel heat sink and it was considered that an electric power was generated by driving a thermoelectric element at this temperature difference. As this temperature difference is utilized, it is possible to arrange a direction of extension of a thermoelectric element (a direction of extension of a thermoelectric material in a part between an electrode at a high temperature side and an electrode at a low temperature side) parallel to a direction of extension of a cooling water flow channel of a microchannel heat sink. That is, because a low temperature part (a cooling water entrance side) and a high temperature part (a cooling water exit side) are produced in a heat sink, per se, a thermoelectric element is attached to the heat sink so as to utilize this temperature difference. Thereby, it is possible for a thermoelectric element to function without inserting a thermoelectric element with a high heat resistance between a heat sink and a heat source, so that it is possible to conduct a thermoelectric conversion more efficiently.

Figure 2A:
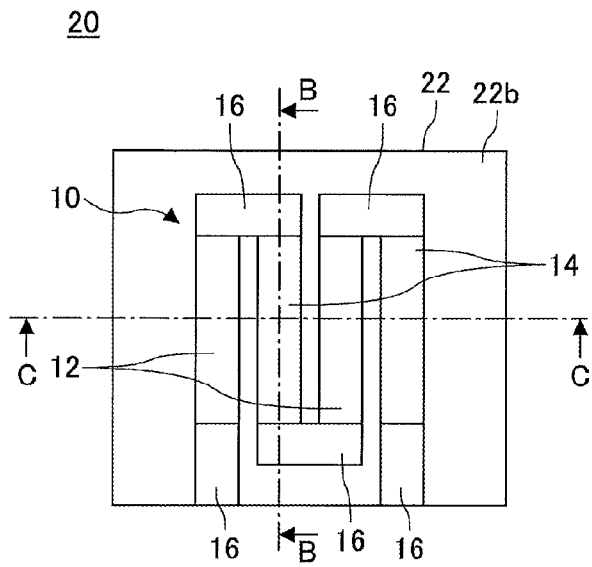
Figure 2B:
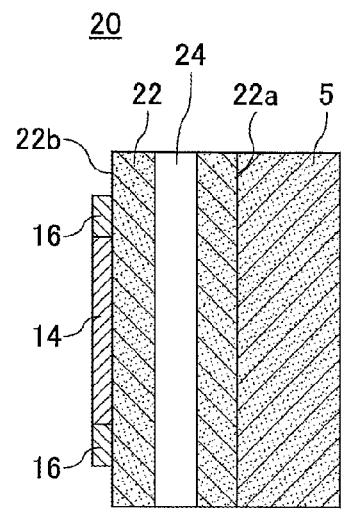
Figure 2C:
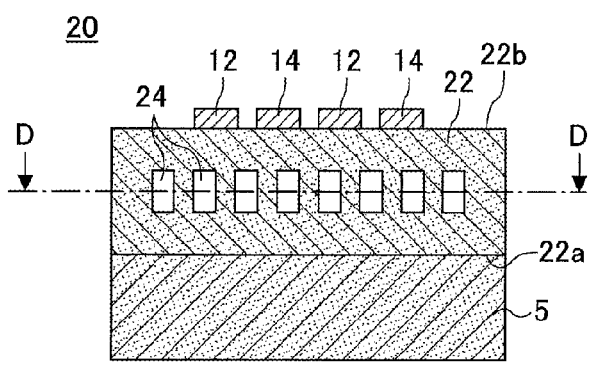
Figure 2D:
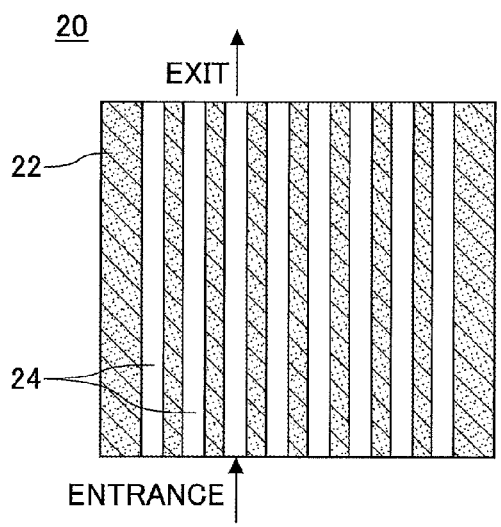

Next, a microchannel cooling device according to a first embodiment will be described. FIGS. 2A, 2B, 2C, and 2D are diagrams illustrating a microchannel cooling device 20 according to the first embodiment. FIG. 2A is a plan view of the microchannel cooling device 20, FIG. 2B is a cross-sectional view along a line B-B of FIG. 2A, FIG. 2C is a cross-sectional view along a line C-C of FIG. 2A, and FIG. 2D is a cross-sectional view along a line D-D of FIG. 2C.

The microchannel cooling device 20 is a device that incorporates a thermoelectric element 10, and while an electronic component 5, such as an LSI, as a heat source is cooled, it is possible to conduct thermoelectric conversion of a part of the heat from the electronic component 5 so as to be converted into and recover an electric energy.

The microchannel cooling device 20 has a device body 22 functioning as a heat sink and the thermoelectric element 10 formed on a surface of the device body 22. Although it is preferable for the device body 22 to be formed of a semiconductor manufacturing material such as, for example, a single crystal silicon, a metallic material such as, for example, an aluminum or a copper may be provided and it is sufficient to be a material with a good heat conductivity wherein it is possible to conduct microprocessing thereof easily. A bottom surface 22a of the device body 22 is such that the electronic component 5 is thermally connected thereto as illustrated in FIG. 2B and FIG. 2C, and heat generated in the electronic component 5 transfers to the device body 22.

A plurality of cooling water flow channels 24 are formed in an interior of the device body 22 that forms a heat sink. The cooling water flow channels 24 extend parallel to one another. Each of the cooling water flow channels 24 has a cross-sectional shape or a cross-sectional dimension in such a manner that the cooling water that flows in an interior thereof is a laminar flow. That is, each of the cooling water flow channels 24 has a longitudinally long rectangular cross section in such a manner that a short side and a long side thereof are, for example, 70 μm and 350 μm, and is set in such a manner that the Reynold's number thereof is less than 2000 (a condition for providing a laminar flow).

As the cooling water at a low temperature is supplied to a side of one end (an entrance side) of the cooling water flow channel 24, the cooling water flows in the cooling water flow channel 24 as a laminar flow and is ejected from an opposite end side (an exit side). The cooling water absorbs heat during flowing in the cooling water flow channel 24 so that the device body 22 is cooled. For the cooling water, a liquid with a low viscosity, a low specific weight, and a high specific heat is preferable wherein a pure water is most preferable. Because pure water, however, reduces an electrical resistance thereof or causes corrosion of an inner wall of a flow channel or occurrence of a microorganism if an impurity ion is mixed therein, an aqueous solution with an organic material such as an ethylene glycol mixed therein is used commonly. For an IT instrument or the like, it is desirable to use a liquid having a high insulating property like a fluorine-containing liquid such as a hydrofluoroether or a silicon-containing liquid such as a silicone oil, in order to avoid an electrical short circuit or corrosion of a component due to water leakage. Alternatively, a refrigerant based on an ethanol may be used.

The thermoelectric element 10 is formed on a top surface 22b of the device body 22. The thermoelectric element 10 includes a plurality of first thermoelectric members 12, a plurality of second thermoelectric members 14, and an electrode 16 for connecting them electrically. The first thermoelectric members 12 are, for example, n-type semiconductor materials and the second thermoelectric members are, for example, p-type semiconductor materials. For n-type semiconductor materials for the first thermoelectric members 12, an n-type silicon or a compound thereof, a bismuth-tellurium ($Bi_2Te_3$), and/or an oxide that contains a zinc (Zn) or a cobalt (Co) is used commonly. For p-type semiconductor materials for the second thermoelectric members 14, a p-type silicon or a compound thereof, a bismuth-antimony-tellurium (BiSbTe), and/or an oxide that contains a sodium (Na) is used commonly. For a material of the electrode 16, a gold or an aluminum is commonly used. Here, it is preferable to form a thin insulating film such as an oxide film on a surface of the device body 22 and form the first thermoelectric members 12, the second thermoelectric members 14, and the electrode 16 thereon, although no illustration is provided in the figure.

The first thermoelectric members 12 and the second thermoelectric members 14 of the thermoelectric element 10 are provided on the tip surface 22b of the device body 22 and extend in a direction identical to a direction of extension of the cooling water flow channels 24 formed in the device body 22. The reason why a direction of extension of the first thermoelectric members 12 and the second thermoelectric members 14 is a direction of extension of the cooling water flow channels 24 is that a temperature distribution is produced in this direction to produce a temperature difference. However, it is not necessary that a direction of extension of the first thermoelectric members 12 and the second thermoelectric members 14 is completely parallel to a direction of extension of the cooling water flow channels 24, and it is sufficient that a connection point at a high temperature side and a connection point at a low temperature side of the first thermoelectric members 12 and the thermoelectric members 14 are suitably arranged at a high temperature side and a low temperature side of the cooling water flow channels 24 so that it is possible to apply a temperature difference to the thermoelectric element 10. Therefore, in the present specification, a direction of extension of the first thermoelectric members 12 and the second thermoelectric members 14 being parallel to (or coinciding with) a direction of extension of the cooling water flow channels 24 does not mean complete parallelism (coincidence) but means that the first thermoelectric members 12 and the second thermoelectric members 14 extend parallel to the cooling water flow channels 24 in such a manner that it is possible to apply a sufficient temperature difference.

As the bottom surface 22a of the microchannel cooling device 20 with a structure as described above is thermally connected to the electronic component 5 as a heat source and the cooling water flows from an entrance side (a low temperature side) of the cooling water flow channels 24, heat from the electronic component 5 is absorbed by the cooling water to cool the electronic component 5. At this time, a temperature difference produced by a temperature distribution along the cooling water flow channels 24 is applied to the thermoelectric element 10, and the thermoelectric element 10 generates a voltage dependent on the temperature difference. Therefore, it is possible for the thermoelectric element 10 to convert a portion of heat emitted from the electronic component 5 into an electric energy to be recovered and reused.

Because the thermoelectric element 10 is not arranged between the electronic component 5 and the device body 22 but is arranged at a side of the top surface 22b of the device body 22, the thermoelectric element 10 is not a heat resistance between the electronic component 5 and the device body 22. Therefore, it is possible to transfer heat from the electronic component 5 to the microchannel cooling device 20 efficiently, and while the electronic component 5 is cooled efficiently, it is possible for the thermoelectric element 10 to convert a portion of such heat into an electric energy to be recovered.

Figure 3A:
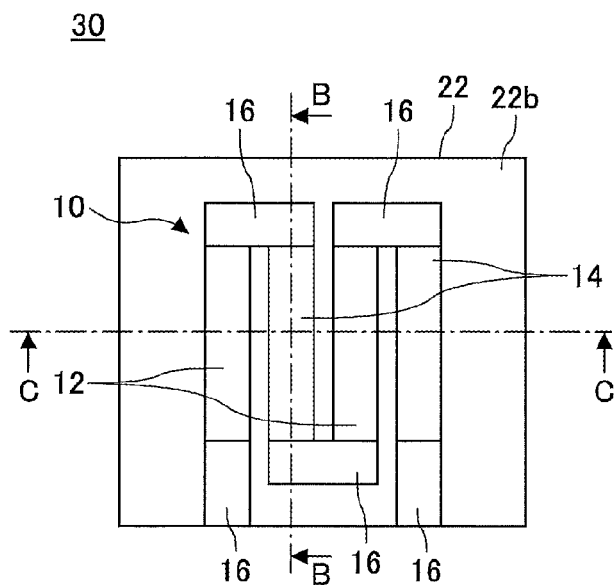
Figure 3B:
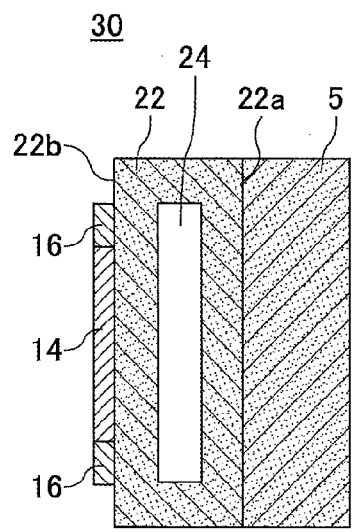
Figure 3C:
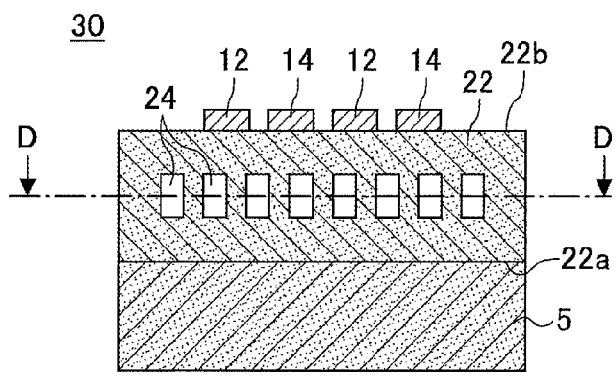
Figure 3D:
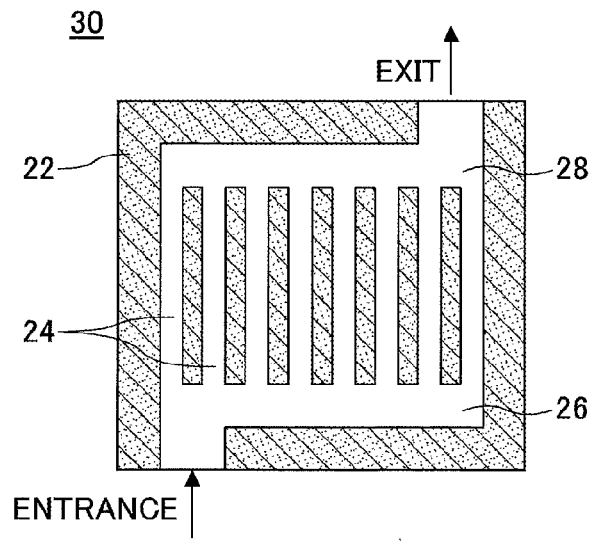

Next, a microchannel cooling device according to a second embodiment will be described. FIGS. 3A, 3B, 3C, and 3D are diagrams illustrating a microchannel cooling device 30 according to the second embodiment. FIG. 3A is a plan view of the microchannel cooling device 30, FIG. 3B is a cross-sectional view along a line B-B of FIG. 3A, FIG. 3C is a cross-sectional view along a line C-C of FIG. 3A, and FIG. 3D is a cross-sectional view along a line D-D of FIG. 3C. In FIGS. 3A, 3B, 3C, and 3D, an identical reference numeral is attached to a component equivalent to a component illustrated in FIGS. 2A, 2B, 2C, and 2D, and a description thereof will be omitted.

As illustrated in FIG. 3D, the microchannel cooling device 30 is different from the microchannel cooling device 20 in that it contains a cooling water supply flow channel 26 and a cooling water drain flow channel 28, and a configuration of another part is similar to that of the microchannel cooling device 20.

In the microchannel cooling device 30, a plurality of cooling water flow channels 24 are provided between the cooling water supply flow channel 26 and the cooling water drain flow channel 28. The cooling water is supplied to the cooling water supply flow channel 26, distributed to a plurality of the cooling water flow channels 24, flows in the cooling water flow channels 24, enters the cooling water drain flow channel 28, and is drained from the cooling water drain flow channel 28.

Figure 4A:
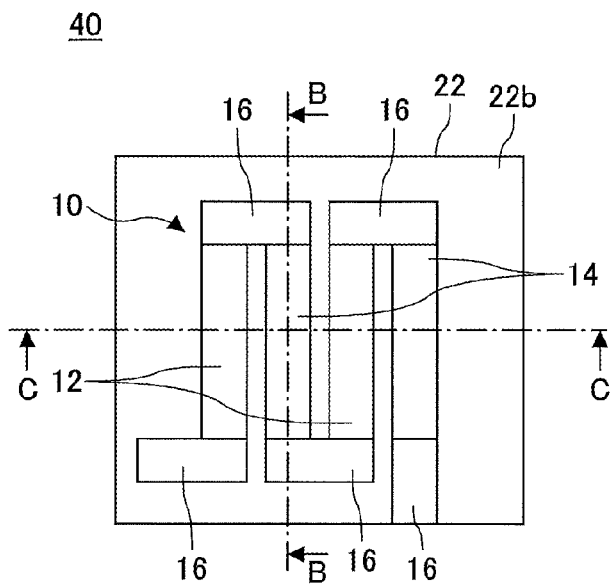
Figure 4B:
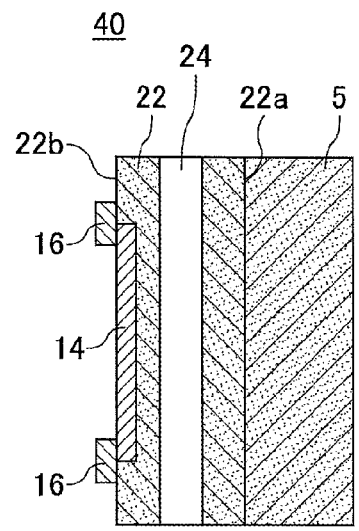
Figure 4C:
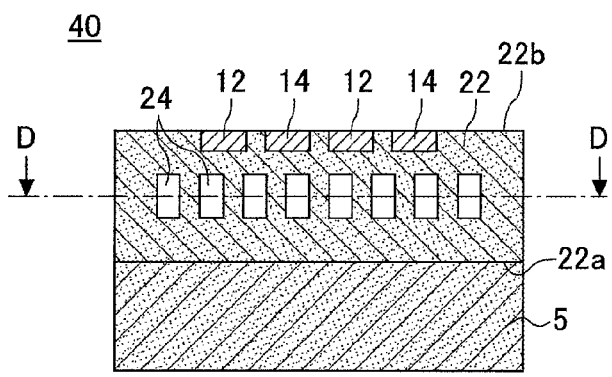
Figure 4D:
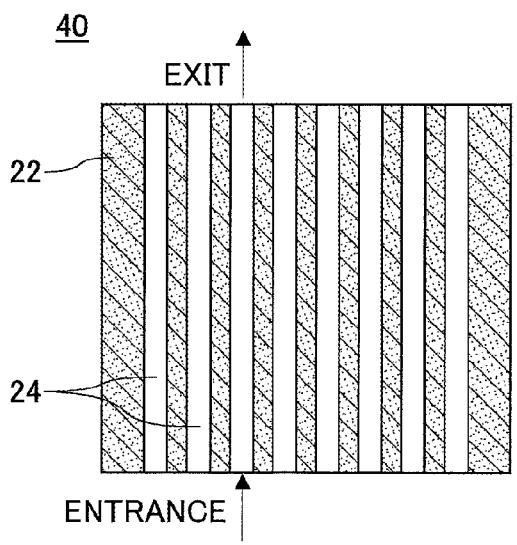

Next, a microchannel cooling device according to a third embodiment will be described. FIGS. 4A, 4B, 4C, and 4D are diagrams illustrating a microchannel cooling device 40 according to the third embodiment. FIG. 4A is a plan view of the microchannel cooling device 40, FIG. 4B is a cross-sectional view along a line B-B of FIG. 4A, FIG. 4C is a cross-sectional view along a line C-C of FIG. 4A, and FIG. 4D is a cross-sectional view along a line D-D of FIG. 4C. In FIGS. 4A, 4B, 4C, and 4D, an identical reference numeral is attached to a component equivalent to a component illustrated in FIGS. 2A, 2B, 2C, and 2D, and a description thereof will be omitted.

As illustrated in FIG. 4B and FIG. 4C, the microchannel cooling device 40 is different from the microchannel cooling device 20 in that the first thermoelectric members 12 and the second thermoelectric members 14 are embedded in the device body 22, and a configuration of another part is similar to that of the microchannel cooling device 20.

The first thermoelectric members 12 and the second thermoelectric members 14 are formed by forming grooves or recesses on the top face 22a of the device body 22 and filling them with thermoelectric materials. As grooves or recesses are filled with thermoelectric materials for forming the first thermoelectric members 12 and the second thermoelectric members 14, it is possible to increase thicknesses of the first thermoelectric members 12 and the second thermoelectric members 14 and increase a cross-sectional area. Therefore, it is possible to decrease electric resistances of the first thermoelectric members 12 and the second thermoelectric members 14 so that it is possible to form a thermoelectric element with a large electric power generation capacity.

Next, a microchannel cooling device according to a fourth embodiment will be described. FIGS. 5A, 5B, 5C, and 5D are diagrams illustrating a microchannel cooling device 50 according to the fourth embodiment. FIG. 5A is a plan view of the microchannel cooling device 50, FIG. 5B is a cross-sectional view along a line B-B of FIG. 5A, FIG. 5C is a cross-sectional view along a line C-C of FIG. 5A, and FIG. 5D is a cross-sectional view along a line D-D of FIG. 5C. In FIGS. 5A, 5B, 5C, and 5D, an identical reference numeral is attached to a component equivalent to a component illustrated in FIGS. 2A, 2B, 2C, and 2D, and a description thereof will be omitted.

As illustrated in FIG. 5B and FIG. 5C, the microchannel cooling device 50 is different from the microchannel cooling device 20 in that the first thermoelectric members 12 and the second thermoelectric members 14 are embedded in the cooling water flow channels 24 in the device body 22, and a configuration of another part is similar to that of the microchannel cooling device 20.

For providing a structure of the first thermoelectric members 12 and the second thermoelectric members 14 being embedded in the cooling water flow channels 24, for example, the device body 22 is formed by being divided into two such that there are upper and lower ones and grooves or recesses to be filled with the cooling water flow channels 24, the first thermoelectric members 12, and the second thermoelectric members 14 are formed on one or both surfaces thereof. Then, grooves or recesses are filled with the first thermoelectric members 12 and the second thermoelectric members 14 and subsequently divided device bodies are joined into one body so as to provide a structure of the first thermoelectric members 12 and the second thermoelectric members 14 being embedded among the cooling water flow channels 24.

In the present embodiment, the first thermoelectric members 12 and the second thermoelectric members 14 are arranged to be very close to the cooling water flow channels 24, and it is possible to apply a temperature difference produced in the cooling water flow channels 24 to the thermoelectric element 10 directly. Furthermore, only the electrode 16 is arranged on the device body 22 and the first thermoelectric members 12 and the second thermoelectric members 14 are covered and protected by the device body 22.

Next, a microchannel cooling device according to a fifth embodiment will be described. FIGS. 6A, 6B, 6C, and 6D are diagrams illustrating a microchannel cooling device 60 according to the fifth embodiment. FIG. 6A is a plan view of the microchannel cooling device 60, FIG. 6B is a cross-sectional view along a line B-B of FIG. 6A, FIG. 6C is a cross-sectional view along a line C-C of FIG. 6A, and FIG. 6D is a cross-sectional view along a line D-D of FIG. 6C. In FIGS. 6A, 6B, 6C, and 6D, an identical reference numeral is attached to a component equivalent to a component illustrated in FIGS. 2A, 2B, 2C, and 2D, and a description thereof will be omitted.

The microchannel cooling device 60 is different from the microchannel cooling device 20 in that a cooling water flow channel is divided into two, and accordingly, the first thermoelectric members 12 and the second thermoelectric members 14 are also divided into two, and a configuration of another part is similar to that of the microchannel cooling device 20.

As illustrated in FIG. 6D, one cooling water supply flow channel 26 is formed at a center of the device body 22 and cooling water drain flow channels 28 are formed at both sides of the cooling water flow channel 26. Each of the cooling water flow channels 24 is divided by the cooling water supply flow channel 26 in opposite directions and extend toward the cooling water drain flow channels 28. The cooling water is supplied from both left and right sides of the cooling water supply flow channel 26, flows in each of the cooling water flow channels 24 as a laminar flow, enters the cooling water drain flow channels 28 at both sides, and is drained from the cooling water drain flow channels 28 at both sides.

As the cooling water flows as described above, a temperature distribution of the device body 22 is such that a part of the cooling water supply flow channel 26 at a center is at a low temperature and portions of the cooling water drain flow channels 28 at both sides are at high temperatures. Therefore, the thermoelectric element 10 is also divided into two so as to match this temperature distribution. Alternatively, two thermoelectric elements 10 are formed.

Even in a case where the cooling water flow channel is branched like the present embodiment, a side of supply of the cooling water is a low temperature side and a side of the drain thereof is at a high temperature, wherein the thermoelectric element 10 is appropriately arranged in such a manner that it is possible to apply such a temperature difference.

Next, a microchannel cooling device according to a sixth embodiment will be described. FIGS. 7A, 7B, 7C, and 7D is a diagram illustrating a microchannel cooling device 70 according to the sixth embodiment. FIG. 7A is a plan view of the microchannel cooling device 70, FIG. 7B is a cross-sectional view along a line B-B of FIG. 7A, FIG. 7C is a cross-sectional view along a line C-C of FIG. 7A, and FIG. 7D is a cross-sectional view along a line D-D of FIG. 7C. In FIGS. 7A, 7B, 7C, and 7D, an identical reference numeral is attached to a component equivalent to a component illustrated in FIGS. 2A, 2B, 2C, and 2D, and a description thereof will be omitted.

A microchannel cooling device according to the present embodiment is not a device independent of the electronic component 5 being a heat source like the microchannel cooling devices according to the first to fifth embodiments described above but is formed as a device incorporated into an interior of the electronic component 5. The electronic component 5 is, for example, a semiconductor integrated circuit device such as an LSI, wherein a semiconductor integrated circuit is formed on a substrate of a semiconductor material such as a silicon. This substrate of a semiconductor material is utilized to form a cooling water flow channel therein and also form a thermoelectric element.

A semiconductor integrated circuit device is generally such that an integrated circuit is formed on one surface (a circuit formation surface 5b) of a substrate 5a of a semiconductor material such as a silicon and an opposite surface (a back surface 5c) is a surface with the substrate 5a being exposed. The microchannel cooling device 20-60 described above are thermally connected to this back surface 5c, and heat transfers from an electronic component thereto. In the present embodiment, the thermoelectric element 10 is formed on this back surface 5c directly. For example, the device body 22 of the microchannel cooling device 20 illustrated in FIGS. 2A, 2B, 2C, and 2D is the substrate 5a of the electronic component 5, wherein the cooling water flow channels 24 are formed in the substrate 5a and the thermoelectric element 10 is formed on the back surface 5c.

Because a cooling device is made in a body of the electronic component 5 being a heat source according to the present embodiment, it is possible to cool the electronic component 5 directly so that it is possible to improve cooling efficiency. Furthermore, because the thermoelectric element 10 is also made within the body of the electronic component 5, there is a less degree of loss of heat transfer to the thermoelectric element 10 and it is possible to utilize the thermoelectric element 10 for an electric power generation effectively. Furthermore, it is possible to reduce a total thickness of the electronic component 5 and a microchannel cooling device combined therewith.

Figure 8:
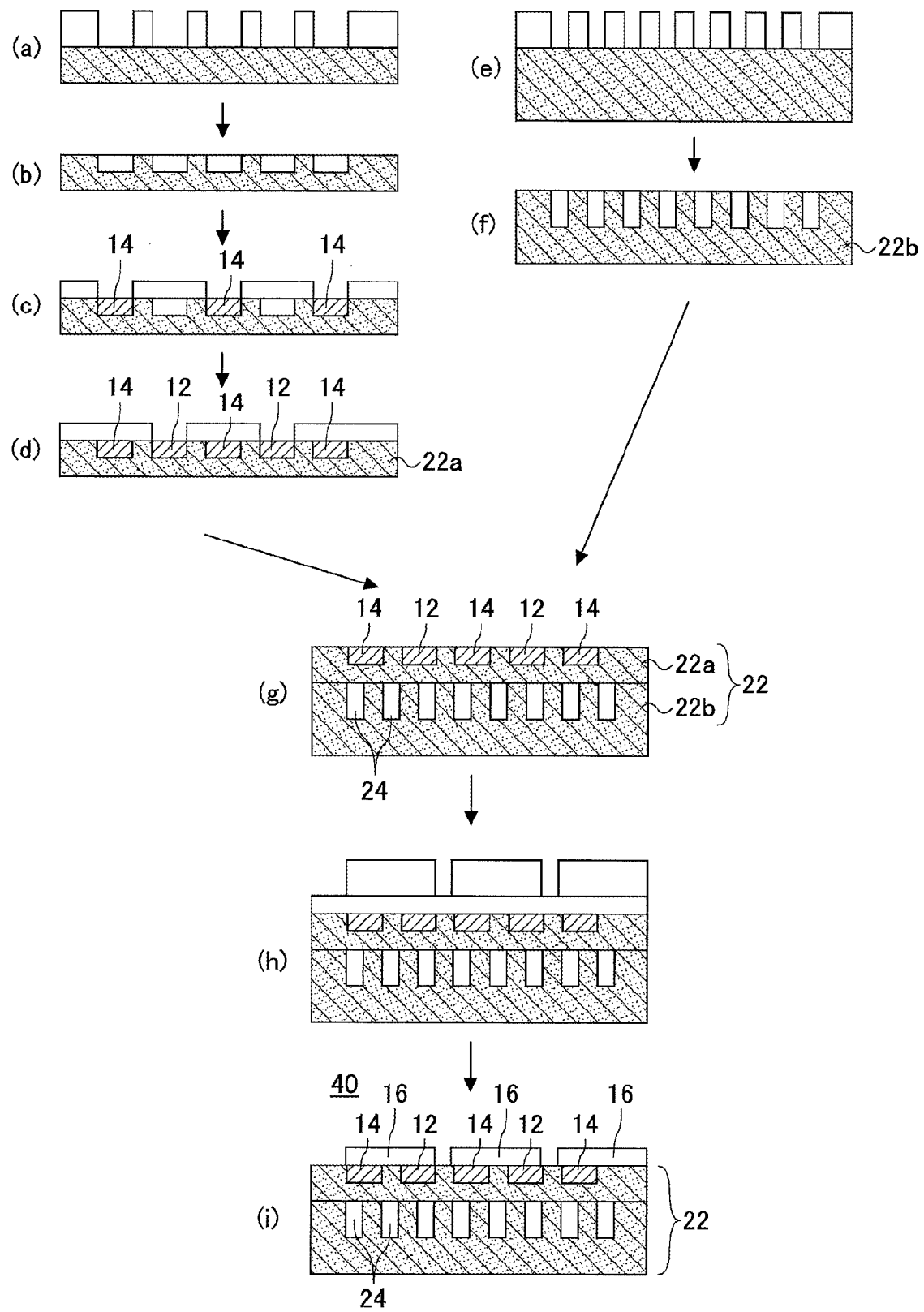
FIG. 8 is a diagram illustrating a process for manufacturing the microchannel cooling device illustrated in FIGS. 4A, 4B, 4C, and 4D.

Next, a method for manufacturing a microchannel cooling device will be described with the microchannel cooling device 40 illustrated in FIGS. 4A, 4B, 4C, and 4D as an example. FIG. 8 is a diagram illustrating a process for manufacturing the microchanel cooling device 40.

The microchannel cooling device 40 is formed by joining a thermoelectric element formation part 22a and a flow channel formation part 22b.

First, a resist pattern is formed on, for example, a single crystal silicon substrate with a thickness of 200 μm (FIG. 8(a)), and while the resist pattern is a mask, deep RIE (reactive ion etching) is applied to the silicon substrate to form grooves or recesses thereon, and the resist pattern is removed (FIG. 8(b)). Then, an oxide film ($SiO_2$ film) with a thickness of about 0.1 μm is formed on a top surface (a surface with grooves formed thereon) of the silicon substrate.

Subsequently, a metal mask for exposing only grooves or recesses on portions for forming the second thermoelectric elements 14 is attached to the silicon substrate. Then, powders to be p-type thermoelectric conversion materials are blended at a certain ratio and the p-type thermoelectric materials are embedded on opening grooves or recesses by an aerosol film formation method for spraying due to a carrier gas (FIG. 8(c)). It is also possible to bind powders by a binder fluid that is composed of, for example, a water and/or an organic component, and to embed in the grooves or recesses by a hot press method or a nano-print method, other than an aerosol film formation method. After p-type thermoelectric materials embedded in the grooves or recesses are solidified, the metal mask is removed. The solidified p-type thermoelectric materials form the second thermoelectric members 14.

Subsequently, a metal mask for exposing only grooves or recesses on portions for forming the first thermoelectric members 12 is attached to the silicon substrate. Then, powders to be n-type thermoelectric conversion materials are blended at a certain ratio and the n-type thermoelectric materials are embedded on opening grooves or recesses by an aerosol film formation method (FIG. 8(d)). It is also possible to bind powders by a binder fluid that is composed of, for example, a water and/or an organic component, and to embed in the grooves or recesses by a hot press method or a nano-print method, other than an aerosol film formation method. After n-type thermoelectric materials embedded in the grooves or recesses are solidified, the metal mask is removed. The solidified n-type thermoelectric materials form the first thermoelectric members 12.

Due to the above process, preparation of the thermoelectric element formation part 22a is completed. On the other hand, the flow channel formation part 22b is prepared separately from preparation of the thermoelectric element formation part 22*a*. First, a resist pattern is formed on, for example, a single crystal silicon substrate with a thickness of 525 μm (FIG. 8(*e*)). Subsequently, while the resist pattern is a mask, deep RIE (reactive ion etching) is applied to the silicon substrate to form grooves or recesses thereon, and the resist pattern is removed (FIG. 8(*f*)). This groove or recess corresponds to the cooling water flow channel 24. As described above, preparation of the flow channel formation part 22*b* is completed. Because preparation of the thermoelectric element formation part 22*a* and preparation of the flow channel formation part 22*b* are conducted in separate processes, it is not particularly necessary to prepare both of them simultaneously.

After preparation of the thermoelectric element formation part 22*a* and preparation of the flow channel formation part 22*b* are completed, the thermoelectric element formation part 22*a* is mounted on a surface with the cooling water flow channels 24 of the flow channel formation part 22*b* being formed thereon, and annealing for joining is conducted at 100° C. to be joined strongly (FIG. 8(*g*)). As the thermoelectric element formation part 22*a* and the flow channel formation part 22*b* are joined, the device body 22 is formed in such a manner that the cooling water flow channels 24 are formed in an interior thereof.

Subsequently, a metal film that includes a 50 nm titanium (Ti) film, a 500 nm gold (Au) film, and the like is formed on the thermoelectric element formation part 22*a* and a resist pattern is formed thereon (FIG. 8(*h*)). This resist pattern is a pattern to cover a portion corresponding to the electrode 16. Then, while the resist pattern is a mask, etching is applied in such a manner that the metal film is removed while only the portion corresponding to the electrode 16 remains. Finally, the resist pattern is removed, so that the microchannel cooling device 40 is completed (FIG. 8(*i*)).

It is also possible to manufacture the microchannel cooling device 20, 30, 60, or 70 by a manufacturing method similar to the method for manufacturing the microchannel cooling device 40 as described above.

The first to sixth embodiments described above do not only function solely but also their characteristics may be combined and used appropriately. For example, it is also possible to apply a configuration for arranging the thermoelectric members among the cooling water flow channels in the fourth embodiment illustrated in FIGS. 5A, 5B, 5C, and 5D to the cooling water flow channels divided into two illustrated in FIGS. 6A, 6B, 6C, and 6D.

Furthermore, the microchannel cooling device described above is such that the thermoelectric element 10 using a Seebeck effect converts heat into electricity to be taken, and on the other hand, an electric current passes through the thermoelectric element 10 reversely so that the thermoelectric element 10 functions as a Peltier element. Therefore, as an appropriate electric current is supplied to the thermoelectric element 10 so as to utilize the Peltier effect, it is also possible to control a temperature distribution of a cooling water flow channel.

Figure 9:
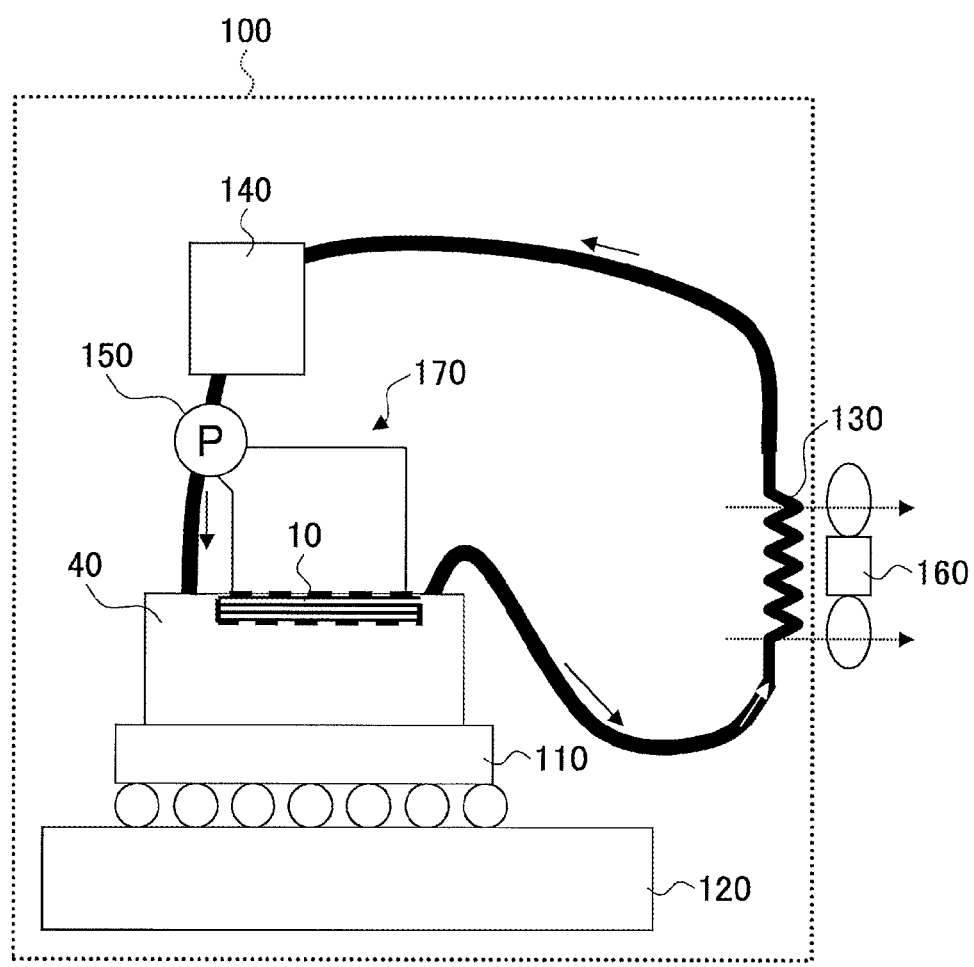
FIG. 9 is a diagram illustrating an example of a microchannel cooling device used in a CPU of a personal computer (PC)

Next, a type of usage of a microchannel cooling device will be described. FIG. 9 is a diagram illustrating an example of the microchannel cooling device 40 described above that is used for a CPU of a personal computer (PC). A CPU 110 that produces heat at a time of an operation thereof is mounted on a main circuit substrate 120 of a PC 100. The microchannel cooling device 40 is joined on and thermally connected to a back surface of the CPU 110.

A cooling water circuit for supplying a cooling water to the microchannel cooling device 40 is provided in the PC 100. A cooling water circuit has a heat exchanger (radiator) 130 for cooling a warmed cooling water drained from the microchannel cooling device 40. The heat exchanger 130 is an air-cooling-type heat exchanger and a motor-driven fan 160 is arranged near the heat exchanger 130.

A cooling water at a low temperature in a reserve tank 140 is supplied to the cooling water flow channels 24 of the microchannel cooling device 40 by a pump 150. Heat from the CPU 110 is absorbed by the cooling water flowing in the cooling water flow channels 24 and the warmed cooling water is drained from the microchannel cooling device 40 and supplied to the heat exchanger 130. Therefore, the CPU 110 is cooled by the microchannel cooling device 40 and kept at an appropriate temperature. The warmed cooling water is cooled by the heat exchanger 130 to be cooled water at a lower temperature again and is returned to the reserve tank 140.

In the above cooling process, a temperature difference is produced in the microchannel cooling device in a direction of flow of the cooling water (a direction of extension of the cooling water flow channels 24) and this temperature difference is applied to the thermoelectric element 10 incorporated in the microchannel cooling device 40. Due to this temperature difference, the thermoelectric element 10 generates an electric power. An electrical circuit 170 is provided for electrically connecting an electrode at a low temperature side and an electrode at a high temperature side of the thermoelectric element 10 to the pump 150 described above and an electric power generated by the thermoelectric element 10 is used for driving the pump 150 (or for assistance of driving the pump 150).

Because heat emitted from the CPU 110 is changed into an electric energy by the thermoelectric element 10 as described above and the pump 150 is driven by this electric power, the pump 150 is driven depending on an operation rate of the CPU 110 (that is, depending on an operation load of the CPU 110). As an operation rate of the CPU 110 is increased to increase an amount of heat generation, an amount of an electric power generated by the thermoelectric element 10 also increases and it is possible to increase an amount of the cooling water supplied by the pump 150 automatically.

Figure 10:
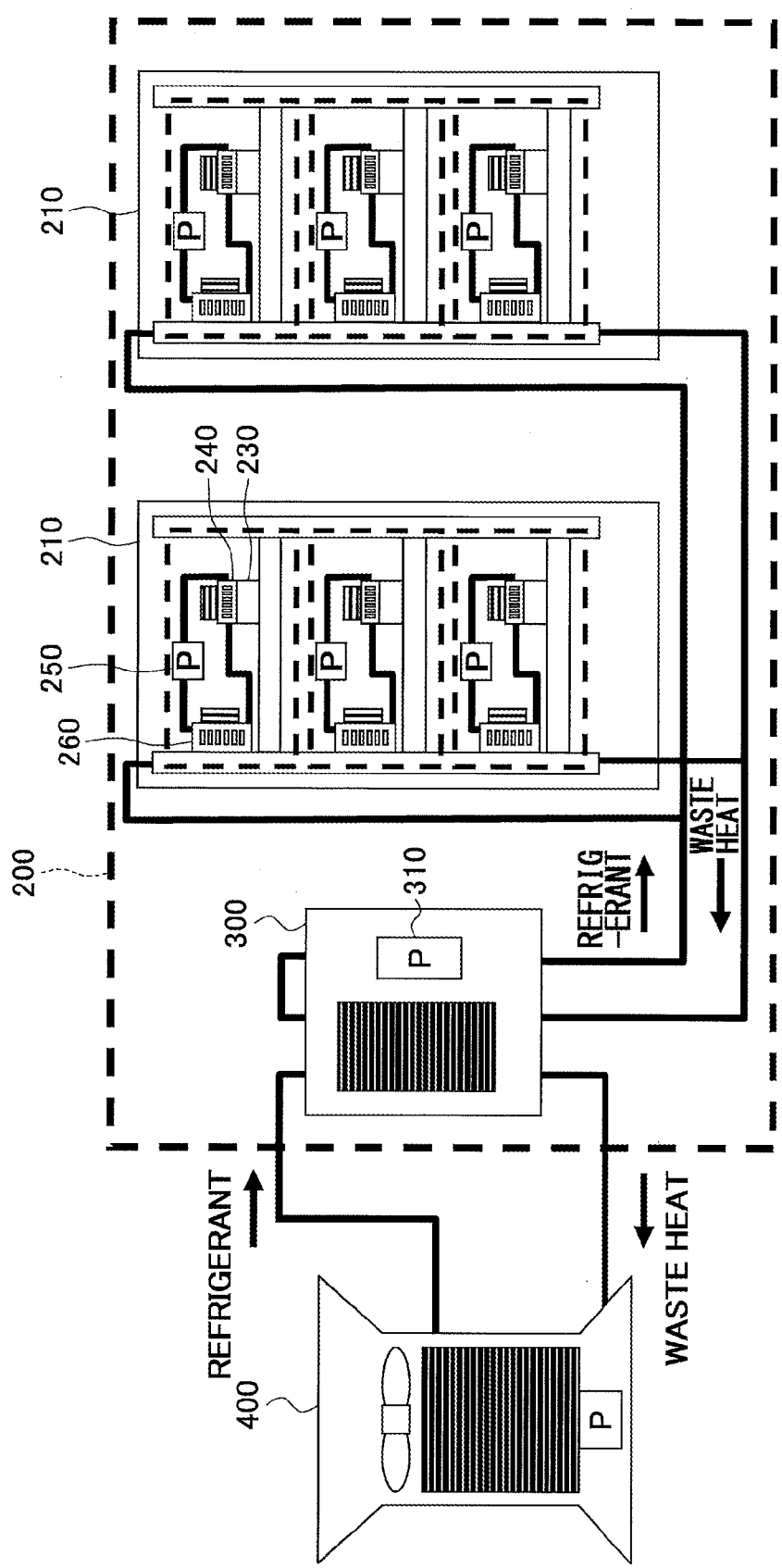
FIG. 10 is a diagram illustrating an example of a microchannel cooling device used in a large-scale computer system.

Next, another type of usage of a microchannel cooling device will be described. FIG. 10 is a diagram illustrating an example of a microchannel cooling device used in a large-scale computer system represented by a rack-server.

A part surrounded with a dotted line in FIG. 10 is a server room 200, and a plurality of servers 210 are arranged in the server room. A server is a rack-type device and a plurality of circuit boards 220 are contained in each server 210. A CPU 230 is mounted on each circuit board 220 and a microchannel cooling device 240 is provided for cooling the CPU 230. The microchannel cooling device 240 is one of the microchannel cooling devices 20-70 described above.

The cooling water stored in a reserve tank (not illustrated) is supplied to the microchannel cooling device 240 by a pump 250. The cooling water flowing in the cooling water flow channels of the microchannel cooling device 240 is supplied to a heat exchanger 260 to be cooled and returned to a reserve tank to be recycled.

The heat exchanger 260 conducts heat exchange with a refrigerant that is circulated in the server room 200 and cools the cooling water supplied to the microchannel cooling device 240. That is, a refrigerant circulating in the server room 200 is supplied to each server 210 to absorb heat from the heat exchanger 260 in the server 210, and subsequently, supplied to a second heat exchanger 300 installed in the server room 200.

Herein, the heat exchanger 260 has a configuration identical to that of the microchannel cooling device 240. That is, the microchannel cooling device is used as the heat exchanger 260. The warmed cooling water is supplied to the cooling water flow channels of the heat exchanger 260, cooled by a refrigerant to be the cooling water at a low temperature, and drained from the heat exchanger 260. At this time, a temperature difference is produced because an entrance side of the cooling water flow channels is a high temperature part and an exit side thereof is a low temperature part. Due to this temperature difference, it is possible for the thermoelectric element of the heat exchanger 260 to generate an electric power.

The second heat exchanger 300 conducts heat exchange between a refrigerant absorbing heat from the heat exchanger 260 in the server 210 to be at a high temperature and a refrigerant at a low temperature that is supplied from a cooler 400 installed outside of the server room 200, so that a refrigerant drained from the heat exchanger 260 is cooled. A refrigerant at a low temperature is sent by a pump 310 and supplied to each server 210 again.

In a cooling system as mentioned above, it is possible to transfer heat generated in the CPU 230 through the microchannel cooling device 240 and the second heat exchanger 300 to an exterior of the server room 200 (the cooler 400), so that it is possible to suppress a temperature rise in the server room 200.

Furthermore, a thermo-electromotive force generated in the thermoelectric element 10 of the microchannel cooling device 240 and a thermo-electromotive force generated in the heat exchanger 260 represent an amount of heat released (that is, a cooling state) of the CPU 230. Therefore, as electric power generated in the microchannel cooling device 240 and electric power generated in the heat exchanger 260 are utilized to drive the pump 250 and the pump 310, it is possible to save electric power supplied to these pumps.

An embodiment is applicable to a microchannel cooling device, a microchannel cooling system, and an electronic instrument.

According to one aspect of the embodiment, it is possible to provide a configuration for cooling an electronic component by using a water cooling type cooling device, wherein a structure thereof is such that it is possible to conduct a thermoelectric conversion efficiently by using a thermoelectric element.

According to one aspect of the embodiment, it is possible to conduct a thermoelectric conversion of heat from a heat source efficiently by using a thermoelectric element while the heat source is cooled.

All examples and conditional language provided herein are intended for the pedagogical purposes of aiding the reader in understanding the invention and the concepts contributed by the inventor to further the art, and are not to be construed as limitations to such specially recited examples and conditions, nor does the organization of such examples in the specification relate to a showing of the superiority and inferiority of the invention.

Although one or more embodiments of the present invention have been described in detail, it should be understood that the various changes, substitutions, and alterations could be made hereto without departing from the spirit and scope of the invention.

What is claimed is:

1. A microchannel cooling device, comprising:
  a heat sink having a liquid refrigerant flow channel having a microscopic cross section and connected to a heat source thermally; and
  a thermoelectric element provided on the heat sink and extending parallel to a direction of extension of the liquid refrigerant flow channel, wherein
  the thermoelectric element includes a first electrode at a high temperature side and a second electrode at a low temperature side, and a part of the thermoelectric element between the first and second electrodes extends parallel to the direction of the extension of the liquid refrigerant flow channel.

2. The microchannel cooling device as claimed in claim 1, wherein the thermoelectric element is provided on a surface at an opposite side of a surface with the heat source thermally connected thereto, with respect to the liquid refrigerant flow channel.

3. The microchannel cooling device as claimed in claim 1, wherein the thermoelectric element is embedded in an interior of the heat sink.

4. The microchannel cooling device as claimed in claim 3, wherein the heat sink has a plurality of the liquid refrigerant flow channels extending parallel to one another and the thermoelectric element is arranged between the adjacent liquid refrigerant flow channels.

5. The microchannel cooling device as claimed in claim 1, wherein the thermoelectric element is an element for generating electric power by utilizing a Seebeck electromotive force of a dissimilar metal junction.

6. The microchannel cooling device as claimed in claim 1, wherein a Reynold's number of the liquid refrigerant flow channel is less than 2000.

7. The microchannel cooling device as claimed in claim 6, wherein a cross section of the liquid refrigerant flow channel has a rectangular shape and a length of a diagonal line thereof is less than or equal to 500·m.

8. The microchannel cooling device as claimed in claim 1, wherein the heat sink is formed of a semiconductor material.

9. The microchannel cooling device as claimed in claim 8, wherein the heat sink is formed of a semiconductor substrate with a semiconductor integrated circuit formed thereon.

10. A microchannel cooling system, comprising:
  an electric component as a heat source;
  a microchannel cooling device, wherein the microchannel cooling device includes a heat sink having a liquid refrigerant flow channel having a microscopic cross section and connected to the electronic component thermally; and a thermoelectric element provided on the heat sink and extending parallel to a direction of extension of the liquid refrigerant flow channel; and
  an electric circuit for supplying electric power generated by the microchannel cooling device to a motor-driven driving part for the cooling system.

11. The microchannel cooling system as claimed in claim 10, wherein the motor-driven driving part includes a pump for supplying a liquid refrigerant to the microchannel cooling device and a cooling fan for cooling a heat exchanger for cooling the liquid refrigerant.

12. An electronic instrument, comprising:
  an electronic component as a heat source;
  a microchannel cooling device, wherein the microchannel cooling device includes a heat sink having a liquid refrigerant flow channel having a microscopic cross section and connected to the electronic component thermally; and a thermoelectric element provided on the heat sink and extending parallel to a direction of extension of the liquid refrigerant flow channel; and
  a pump for supplying a liquid refrigerant to the microchannel cooling device, wherein electric power generated by the microchannel cooling device is supplied to the pump to drive the pump.

\* \* \* \* \*